United States Patent [19]
Kimura et al.

[11] Patent Number: 5,877,067
[45] Date of Patent: Mar. 2, 1999

[54] METHOD OF MANUFACTURING A SEMICONDUCTOR DEVICE

[75] Inventors: Koji Kimura, Kanagawa-ken; Rintarou Okamoto; Yuichi Nakashima, both of Fukuoka-ken, all of Japan

[73] Assignee: Kabushiki Kaisha Toshiba, Kawasaki, Japan

[21] Appl. No.: 839,168

[22] Filed: Apr. 23, 1997

[30] Foreign Application Priority Data

Apr. 23, 1996 [JP] Japan ................................. 8-100773

[51] Int. Cl.⁶ ........................................................ H01L 21/76
[52] U.S. Cl. .................. 438/430; 438/431; 438/432; 438/425; 438/361; 148/DIG. 50
[58] Field of Search ...................... 438/361, 363, 438/430, 431, 432, 425; 148/DIG. 50

[56] References Cited

U.S. PATENT DOCUMENTS

| | | | |
|---|---|---|---|
| 4,631,803 | 12/1986 | Hunter et al. | 438/426 |
| 5,358,891 | 10/1994 | Tsang et al. | 438/426 |
| 5,474,953 | 12/1995 | Shimizu et al. | 438/426 |
| 5,561,073 | 10/1996 | Jerome et al. | 438/436 |

*Primary Examiner*—Trung Dang
*Attorney, Agent, or Firm*—Michael N. Meller

[57] ABSTRACT

The present invention provides a method of manufacturing a semiconductor device to prevent the generation of crystalline defects due to shorting between interconnects resulting from etch residue as a result of the generation of vertical bird's beaks on top of the trench during field oxidation layer formation. The method includes forming an epitaxial layer over a semiconductor substrate, depositing a first $SiO_2$ layer, an SiN layer and a second $SiO_2$ layer in that order upon said epitaxial layer and forming a trench from the second $SiO_2$ layer extending into the semiconductor substrate. A third $SiO_2$ layer is formed coating said trench with a region of said third $SiO_2$ layer removed adjacent to said first $SiO_2$ layer to expose a portion of said epitaxial layer within said trench. The trench is then filled with a first polysilicon layer to coat the third $SiO_2$ layer and the first $SiO_2$ layer followed by removal of the second $SiO_2$ layer and the SiN layer and finally, the first $SiO_2$ layer is oxidized to a depth extending into the trench corresponding to the exposed portion of the epitaxial layer so as to form a field oxide layer.

11 Claims, 13 Drawing Sheets

METHOD OF MANUFACTURING A SEMICONDUCTOR DEVICE

BACKGROUND OF THE INVENTION

The present invention relates to a method for manufacturing integrated circuits such as high speed bipolar ICs and high speed BiCMOSICs.

In conventional semiconductor integrated circuit manufacture an isolated region is formed on the semiconductor device in accordance with the practice of forming a trench in the silicon substrate to be filled with polysilicon followed by forming a field oxide layer on the silicon substrate.

The conventional practice of forming an isolation region in a semiconductor device so that a field oxide layer may be fabricated thereon is hereafter described in connection with FIGS. 23 through 30 inclusive.

First, in order to fabricate an n-type epitaxial layer 2, 1.0 $\mu$m thick, a 1E16 $cm^{-3}$ dopant concentration is formed on the surface of a p-type semiconductor (silicon) substrate and a n-type buried layer 3 of a 1E18 $cm^{-3}$ dopant concentration is formed underneath by a known technique. Second, a 50 nm thick first $SiO_2$ layer 4 is fabricated on the n-type expitaxial layer 2 by an oxidation method. Third, a 1500 nm thick SiN layer 5 and a 1.0 $\mu$m thick second $SiO_2$ layer 6, such as by a CVD (Chemical-Vapor Deposition) method, is fabricated in that order (FIG. 23.)

Now, using a lithography technique, form a resist pattern 7 having a pocket with a 1.0 $\mu$m wide opening 8(FIG. 24).

Anisotropically etch through the second $SiO_2$ layer 6 over the mask of resist pattern 7 to extend the opening 8 to the n-type epitaxial layer 2 (FIG. 25).

Anisotropically etch the silicon substrate to remove 6 $\mu$m deep of the substrate using the second $SiO_2$ layer 6 as a mask to form a trench 9 (FIG. 26) extending from the first $SiO_2$ layer 4 with the trench 9 having sidewalls in cross section.

Next, oxidize the sidewalls of the trench 9 to form a third $SiO_2$ layer 10 using a conventional oxidization method. Deposit a first polysilicon layer 11a in the trench 9 and using the second $SiO_2$ layer 6 as an etch buffer layer etchback the first polysilicon layer 11a (FIG. 27).

Remove the exposed second $SiO_2$ layer 6 using buffered oxygen fluoride (FIG. 28); then etchback the first polysilicon layer 11a using the SiN layer 5 as an etch buffer layer by a CMP (Chemical-Mechanical Polishing) method to complete filling of the trench (FIG. 29). Then, form a desired pattern on the SiN layer 5 by a known technique.

Finally, form a 500 nm thick field oxide layer 13 over the n-type epitaxial layer 2 and the first polysilicon layer 11a (FIG. 30).

At this time, a concavity is formed on the surface of the field oxide layer 13 on top of the third $SiO_2$ layer 10 against the trench sidewall; two vertical bird's beaks 14 are also formed on top of the third $SiO_2$ layer 10. The vertical bird's beaks are defects in the surface of field oxide layer 13 equivalent to that of a gouge.

In the process of producing a conventional semiconductor following the aforementioned steps it is believed that because of the third $SiO_2$ layer 10 that exists, that the trench sidewalls induces formation of the aforementioned vertical bird's beaks 14 at the point where the third $SiO_2$ layer 10 and the field oxide layer 13 meet during LOCOS oxidation. Upon formation of the field oxide layer two corresponding bird's beaks 14 are produced on top of the third $SiO_2$ layer. As a result, when etch-patterning a conductive layer to introduce electrodes in a step subsequent to the LOCOS oxidation, the concavity tends to generate etch residues from the conductive layer; this is particularly true in anisotropic etching, inducing interconnect shorting due to the current flowing through the residues. In conventional technology, the etch residues in the bird's beaks 14 are removed by excessive etching.

The vertical bird's beaks 14 are generated either during oxidation of the semiconductor substrate 1 or when the first polysilicon layer 11a is filled into the trench 9 due to oxygen diffusing into the third $SiO_2$ layer 10 against the trench sidewall during LOCOS oxidation; wherein the vertical bird's beaks 14 accompanies volume expansion generating stress on top of the trench. This stress is one of the factors that cause crystalline defects in the semiconductor substrate 1.

In the conventional method of manufacturing a semiconductor device, vertical bird's beaks are created on top of the trench when forming a trench device isolation region; the vertical bird's beaks induce shorting between interconnects, generating crystalline defects in the semiconductor substrate 1.

The present invention intends to resolve the above problem in the manufacture of a semiconductor device by preventing the generation of vertical bird's beaks to avoid shorting between interconnects in the semiconductor device due to etch residues from a conductive layer, and to prevent generation of crystalline defects on semiconductor substrates, etc.

SUMMARY OF THE INVENTION

The method of manufacturing a semiconductor device in accordance with the present invention comprises the steps of:

a) forming an epitaxial layer over a semiconductor substrate;

b) depositing a first $SiO_2$ layer, an SiN layer and a second $SiO_2$ layer in that order upon said epitaxial layer;

c) forming a trench from said second $SiO_2$ layer extending into said semiconductor substrate with said trench having sidewalls in cross section;

d) forming a third $SiO_2$ layer coating in said trench over said sidewalls;

e) removing a region of said third $SiO_2$ layer adjacent to said first $SiO_2$ layer to expose a portion of said epitaxial layer within said trench;

f) filling said trench with a first polysilicon layer;

g) removing said second $SiO_2$ layer and said SiN layer; and h) oxidizing said first $SiO_2$ layer to a depth extending into said epitaxial layer so as to form a field oxide layer.

Another embodiment of the present invention of manufacturing a semiconductor device comprises the steps of:

a) forming an epitaxial layer over a semiconductor substrate;

b) depositing a first $SiO_2$ layer, an SiN layer, and a second $SiO_2$ layer in that order upon said epitaxial layer;

c) forming a trench from said second $SiO_2$ layer extending into said semiconductor substrate with said trench having sidewalls in cross section;

d) forming a third $SiO_2$ layer coating in said trench over said sidewalls;

e) filling said trench with a first polysilicon layer;

f) removing said second $SiO_2$ layer to expose said SiN layer after the formation of said first polysilicon layer;

g) removing a region of said third $SiO_2$ layer adjacent to said first $SiO_2$ layer to expose a portion of said epitaxial layer within said trench;

h) depositing a second polysilicon layer on said third $SiO_2$ layer that remains within said trench following step g and on said first polysilicon layer in said trench;

i) removing said SiN layer after the formation of said second polysilicon layer; and j) oxidizing said second polysilicon layer to form a field oxide layer to a depth extending within said trench inclusive of said exposed portion of said epitaxial layer.

BRIEF DESCRIPTION OF THE PREFERRED EMBODIMENTS

Figure 1:
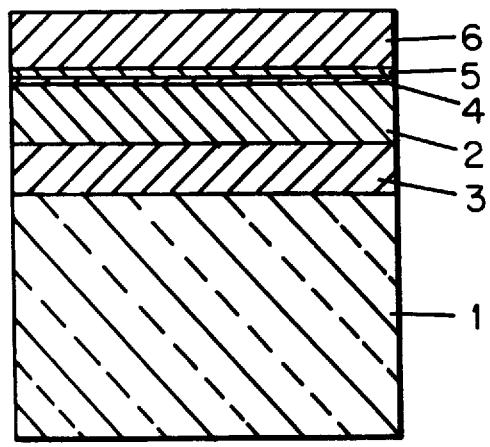
FIG. 1 shows the cross section of a substrate of the first embodiment showing steps of fabricating a first $SiO_2$ layer, an SiN layer, a second $SiO_2$ layer.

According to the present invention, when fabricating a field oxide layer on a first or second polysilicon layer of a semiconductor integrated circuit, a third $SiO_2$ layer is formed disposed against the internal sidewall surfaces of a trench extending into the substrate of said semiconductor device with the third $SiO_2$ layer having a region removed therefrom and covered with the first or second polysilicon layer to prevent the third $SiO_2$ layer from undergoing field oxidation and from volume expansion, thus controlling the generation of bird's beaks.

As a result, shorting between interconnects due to the etch-residue from the conductive layer is prevented and generation of crystalline quality of the semiconductor substrates, etc. is improved.

The embodiments of the present invention are described herein by referring to the drawings. FIG. 1 through 11 show the first embodiment of the present invention which is produced in accordance with the following details of construction:

Fabricate an epitaxial layer 2, 1.0 μm thick, with 1E16 cm³ dopant concentration on a p-type semiconductor silicon substrate 1; under the epitaxial layer 2, form a dopant n-type buried layer 3 by a known technique. Now, fabricate a first $SiO_2$ layer 4, 50 nm thick, on the surface of the N-type epitaxial layer 2 by an oxidation method; then, fabricate a SiN layer 5, 150 nm thick over the first $SiO_2$ layer 4, and a second $SiO_2$ layer 6, 1.0 μm thick, in that order (FIG. 1).

Figure 2:
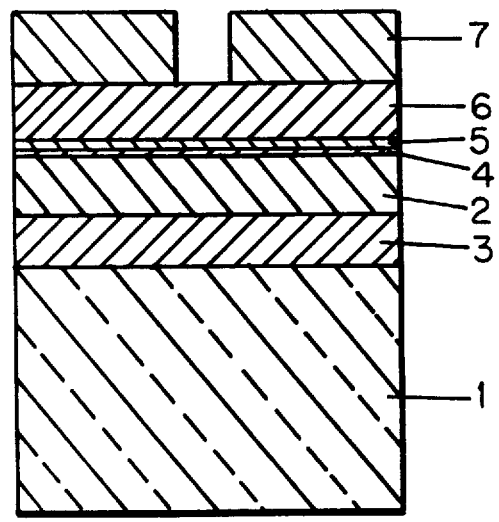
FIG. 2 shows the cross section of a substrate of the first embodiment showing the step of fabricating a resist pattern having a groove with an opening on the second $SiO_2$ layer.

Next, fabricate a resist pattern 7 having a groove with a 1.0 μm opening 8 by lithography technology (FIG. 2).

Figure 3:
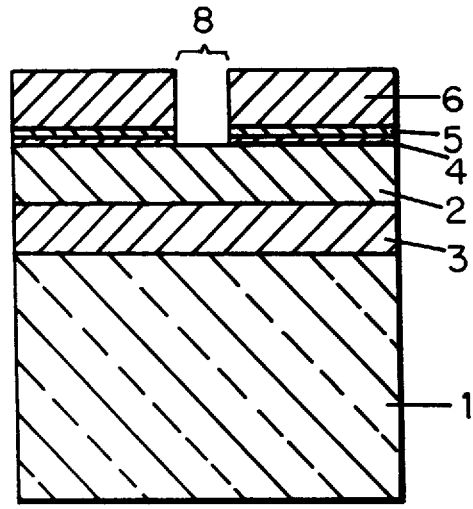
FIG. 3 shows the cross section of a substrate of the first embodiment showing the step of forming an opening reaching an n-type epitaxial layer.

Anisotropically etch the second $SiO_2$ layer 6 using the resist pattern 7 as a mask to extend the opening 8 to the n-type epitaxial layer 2 (FIG. 3).

Figure 4:
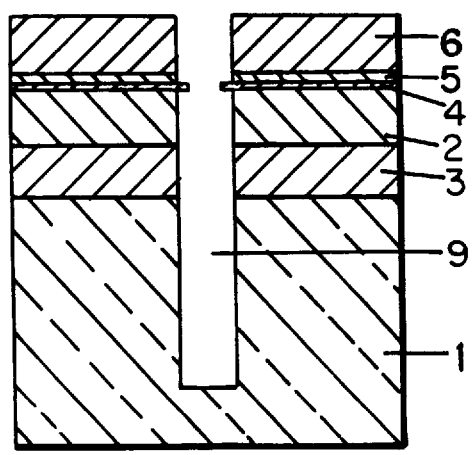
FIG. 4 shows the cross section of a substrate of the first embodiment showing the step of forming a trench.

Anisotropically etch the silicon substrate to remove 6 μm deep of the substrate using the second $SiO_2$ layer 6 as a mask to form a trench 9 having sidewalls in cross section (FIG. 4).

Figure 5:
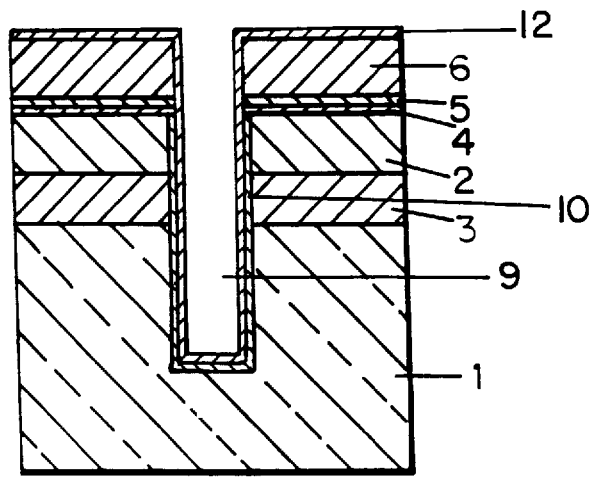
FIG. 5 shows the cross section of a substrate of the first embodiment showing the steps of fabricating a third $SiO_2$ layer on the trench sidewall and depositing polysilicon thereon.
Figure 6:
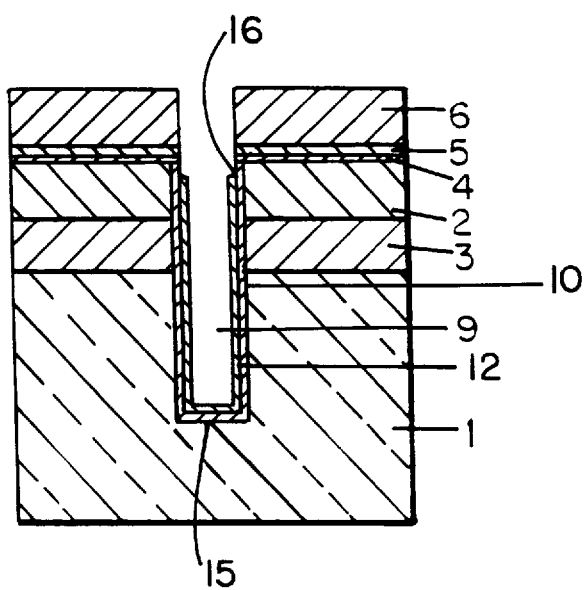
FIG. 6 shows the cross section of a substrate of the first embodiment showing the steps of removing the polysilicon layer on the top and bottom of the trench and forming the region in the trench.

Oxidize the sidewalls of the trench 9 to fabricate a third $SiO_2$ layer 10. Then, deposit a polysilicon layer 12 over the trench 9 sidewall and over the second $SiO_2$ layer 6, 150 nm thick, (FIG. 5). Anisotropically etch the polysilicon layer 12 in the trench 9 to a depth of 250 nm deep. The polysilicon layer 12 is removed to below the first $SiO_2$ layer 4 to expose a region 16 of the third $SiO_2$ layer 10. The third $SiO_2$ layer 10 is then etched in the exposed region 16 of the trench 9 for exposing a portion of the n-type epitaxial layer 2. Also, anisotropically etch the polysilicon 12 at the bottom end 15 of the trench 9 (FIG. 6).

Figure 7:
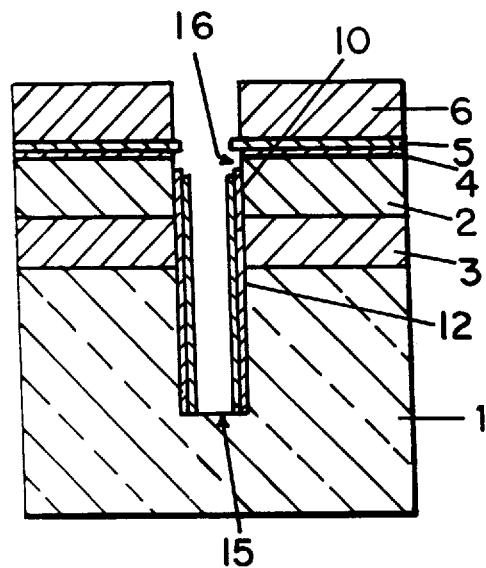
FIG. 7 shows the cross section of a substrate of the first embodiment showing the step of removing the edge of the third $SiO_2$ layer.

Remove the third $SiO_2$ layer 10 at the bottom end 15 in the trench 9 with buffered oxygen fluoride by using the polysilicon layer 12 as a mask (FIG. 7). Now, etch the polysilicon layer 12 within the trench 9 to expose the third $SiO_2$ layer 10 along the sidewalls of the trench 9 (FIG. 8).

Figure 8:
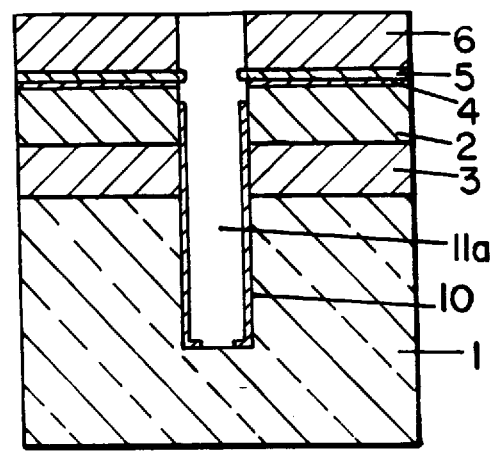
FIG. 8 shows the cross section of a substrate of the first embodiment showing the step of fabricating a first polysilicon layer in a trench.
Figure 9:
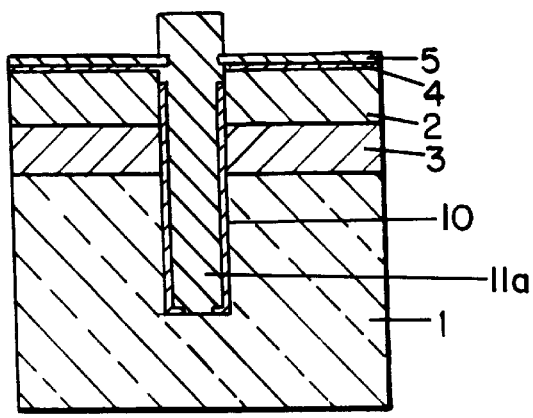
FIG. 9 shows the cross section of a substrate of the first embodiment showing the step of removing the second $SiO_2$ layer.

Fill a first polysilicon layer 11a in the trench 9 by a CVD method, then, etchback the first polysilicon layer 11a using the second $SiO_2$ layer 6 as the etch-buffer layer via a CMP method (FIG. 8). At this time, the surface of the first polysilicon layer 11a and the surface of the second $SiO_2$ layer 6 may be etched back to be on the same plane (FIG. 8).

Figure 10:
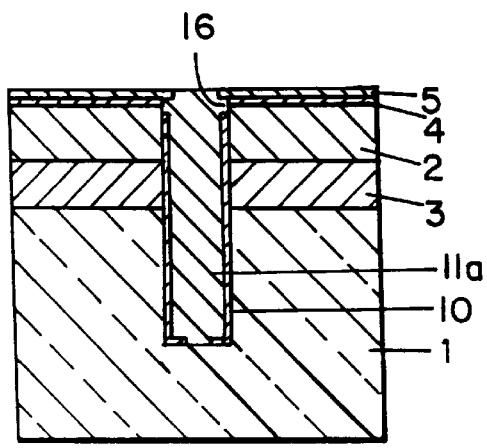
FIG. 10 shows the cross section of a substrate of the first embodiment showing the step of etching back the first polysilicon layer.

Next, remove the exposed second $SiO_2$ layer 6 using buffered oxygen fluoride (FIG. 9), and etchback the first polysilicon layer 11a using the SiN layer 5 as the etch-barrier layer by a CMP method to complete the trench refill (FIG. 10). At this time, the surface of the first polysilicon layer 11a and the surface of SiN layer 5 can be etched back to be on the same plane (FIG. 10).

Figure 11:
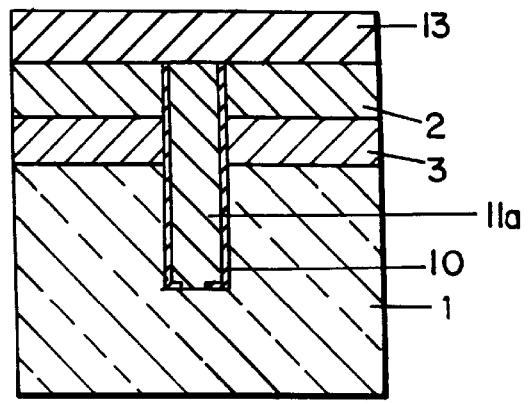
FIG. 11 shows the cross section of a substrate of the first embodiment showing the step of fabricating a field oxide layer after the removal of the SiN layer and the first $SiO_2$ layer.

Finally, pattern SiN layer 5 to a desired pattern by a known technique to form a field oxide layer 13, 500 nm thick, by an oxidation method (FIG. 11). After patterning the SiN layer 5, remove the first $SiO_2$ layer 4 before fabricating a field oxide layer 13.

After fabricating a field oxide layer 13, a conductive layer (not shown) may be fabricated on the field oxide layer 13 for patterning.

In the first embodiment, referring to FIGS. 5 through 7, a portion of the third $SiO_2$ layer 10 fabricated on a semiconductor substrate 1 along the region 16 on top of the trench 9 is removed by etching the third $SiO_2$ layer 10 using a polysilicon layer 12 as a mask. However, the mask of polysilicon layer 12 does not necessarily take the form of a layer to obtain sufficient benefits of the present invention, for example, polysilicon may be filled into the trench 9 up to the polysilicon layer 12 as illustrated in FIG. 6; then, the surface of $SiO_2$ layer 10 may be etched using the polysilicon layer 12 as a mask which should be removed later. Also, materials other than polysilicon may be used for masking as long as the material is selective to different exposed surfaces during etching. In short, the benefits of the present invention can be obtained if there is a step in which the third $SiO_2$ layer 10 is exposed within the region 16 of the trench 9.

Moreover, in the step illustrated in FIG. 7, the third $SiO_2$ layer 10 at the bottom end 15 of the trench 9 is removed. As a result, the first polysilicon layer 11a is deposited directly on the semiconductor substrate 1 as illustrated in FIG. 8. The structure suggests that the semiconductor substrate 1 and the first polysilicon layer 11a electrically contact each other in this structure. It should be noted that if the depth of the trench 9 or the film thickness of the third $SiO_2$ layer are in the range of conventional technology. It is within the scope of the present invention to have the semiconductor substrate 1 electrically isolated from the first polysilicon layer 11a. For example if the trench 9 cannot be deep enough or there is a need for a thick third $SiO_2$ layer to be thinner than usual, the step mentioned above may apply wherein the third $SiO_2$ layer 10 is etched back using the polysilicon layer 12 to refill the trench 9 as a mask; this will not remove the third $SiO_2$ layer at the bottom end 15 of the trench 9, thus electrically isolating the semiconductor substrate 1 and the first polysilicon layer 11a.

The second embodiment of the present invention will be described herein in connection with FIG. 12 through 22 inclusive.

Figure 12:
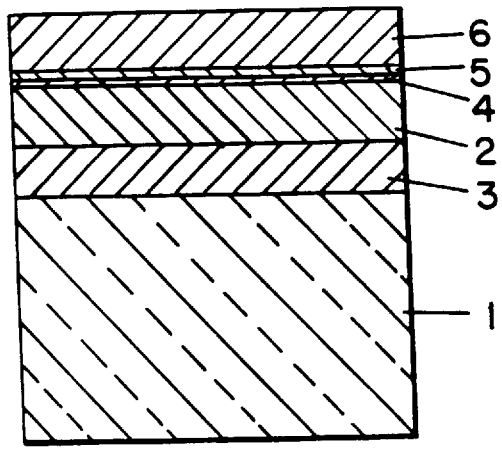
FIG. 12 shows the cross section of a substrate of the second embodiment showing the steps of fabricating the first $SiO_2$ layer, an SiN layer, a second $SiO_2$ layer.

First, fabricate an n-type epitaxial layer 2, 1.0 μm, 1E16 cm⁻³ dopant concentration on a p-type semiconductor silicon substrate 1 between which is formed an n-type buried layer 3 of 1E18 cm⁻³ dopant concentration. Next, fabricate a first $SiO_2$ layer 4, 50 nm thick, on the n-type epitaxial layer 2 by an oxidation method; then, fabricate an SiN layer 5, 1500 nm thick, and a second $SiO_2$ layer 6, 1.0 μm thick, in that order, by the CVD method (FIG. 12).

Figure 13:
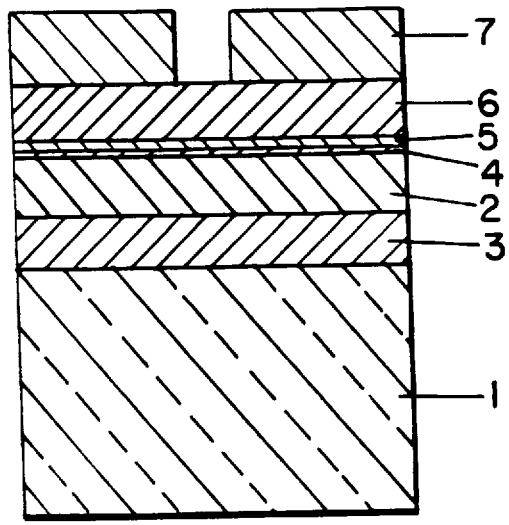
FIG. 13 shows the cross section of a substrate of the second embodiment showing the step of fabricating a resist pattern having a groove with an opening on the second $SiO_2$ layer.
Figure 14:
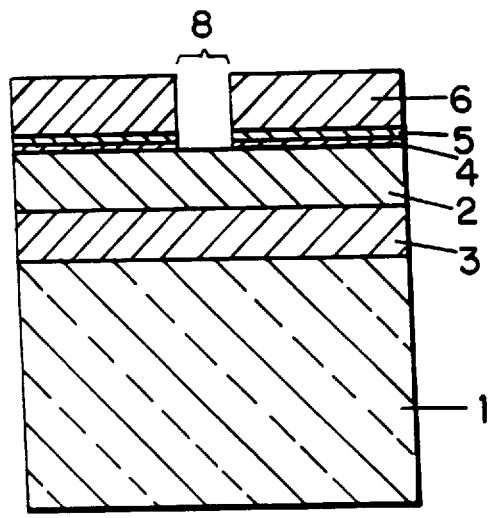
FIG. 14 shows the cross section of a substrate of the second embodiment showing the step of forming an opening reaching an n-type epitaxial layer.

Then, form a resist patten 7 having a 1.0 μm wide opening 8 using lithography technology (FIG. 13). Anisotropically etch the second $SiO_2$ layer 6 using the resist patten 7 as a mask to extend the opening 8 to the n-type epitaxial layer 2 (FIG. 14).

Figure 15:
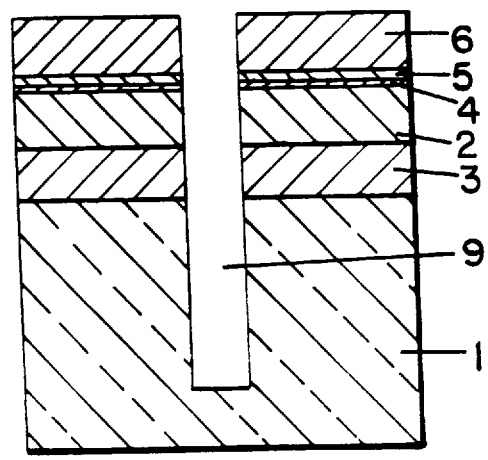
FIG. 15 shows the cross section of a substrate of the second embodiment showing the step of forming a trench.

Anisotropically etch the semiconductor substrate 1 to remove 6 μm deep of the substrate using the second $SiO_2$ layer 6 as a mask to form a trench 9 extending from the opening 8 and having sidewalls in cross section (FIG. 15).

Figure 16:
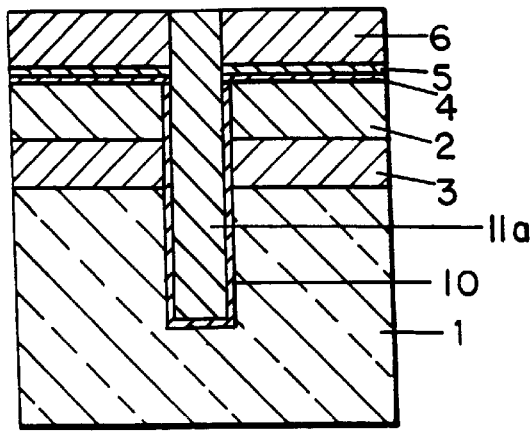
FIG. 16 shows the cross section of a substrate of the second embodiment showing the step of fabricating the third $SiO_2$ layer and then forming a first polysilicon layer in the trench.
Figure 17:
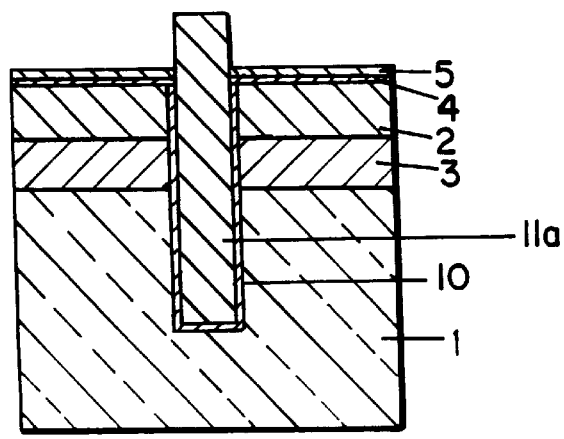
FIG. 17 shows the cross section of a substrate of the second embodiment showing the step of removing the second $SiO_2$ layer.

Next, oxidize the sidewalls of the trench 9 to fabricate a third $SiO_2$ layer 10 by an oxidation method; then, deposit a first polysilicon layer 11a, 1.5 μm thick, by a CVD method; and etchback the first polysilicon layer 11a using the second $SiO_2$ layer 6 as an etch-barrier layer by a CMP method (FIG. 16). At this time, the surface of the first polysilicon layer 11a and the surface of the second $SiO_2$ layer 6 may be etched back to the same plane.

Figure 18:
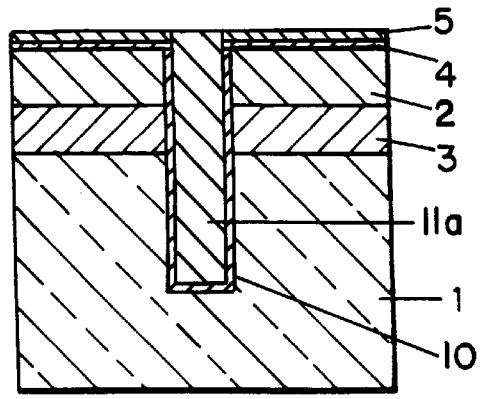
FIG. 18 shows the cross section of a substrate of the second embodiment showing the step of etching back the first polysilicon layer.

After that, remove the exposed second $SiO_2$ layer 6 using buffered oxide fluoride (FIG. 17); etchback the first polysilicon layer 11a up to the surface of the SiN layer 5 using the SiN layer 5 as an etch-buffer layer in the CMP method (FIG. 18). The surface of the first polysilicon layer 11a and the surface of the SiN layer may be etched back to the same plane.

Figure 19:
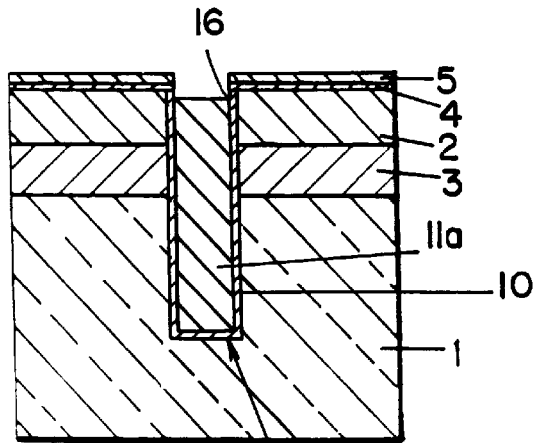
FIG. 19 shows the cross section of a substrate of the second embodiment showing the step of removing the top of the first polysilicon layer and exposing the edge of the third $SiO_2$ layer.

Upon completion of etching back the first polysilicon layer 11a, anisotropically etch back to form a region 16 along the sidewalls of the trench 9, which is 250 nm deep from the surface of the SiN layer 5 (FIG. 19).

Figure 20:
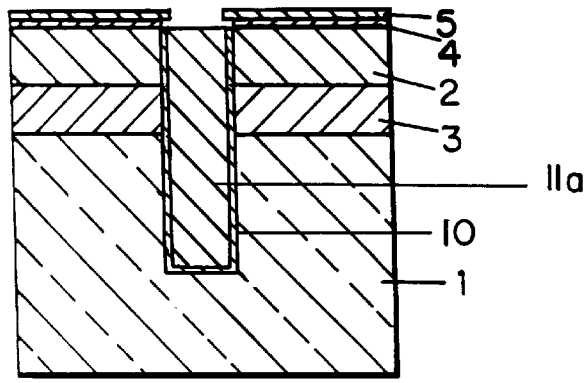
FIG. 20 shows the cross section of a substrate of the second embodiment showing the step of removing the third $SiO_2$ layer.

Next, remove the third SiO$_2$ layer 10 exposed in the trench within region 16, using buffered oxide fluoride. The polysilicon layer 11a acts as a mask to prevent the buffered oxide fluoride from attacking the remainder of layer 10 (FIG. 20).

Figure 21:
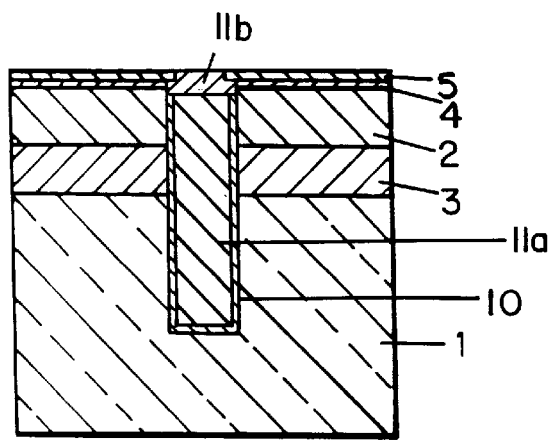
FIG. 21 shows the cross section of a substrate of the second embodiment showing the step of fabricating the second polysilicon layer over the first polysilicon layer.

Then, deposit the second polysilicon layer 11b, 0.5 μm thick, over the first polysilicon layer 11a, 0.5 μm thick, by a CVD method; etchback the second polysilicon layer 11b using the SiN layer 5 as an etch-barrier layer by a CMP method to complete the refilling of the trench (FIG. 21). At this time, the surface of the second polysilicon layer 11b and the surface of the SiN layer can be etched back to be on the same plane.

Figure 22:
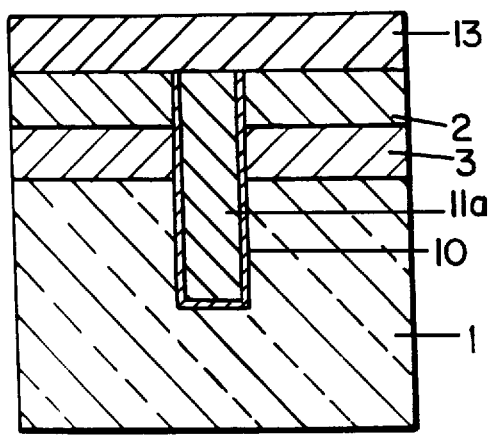
FIG. 22 shows the cross section of a substrate of the second embodiment showing the step of fabricating a field oxide layer after the removal of the SiN layer and the first $SiO_2$ layer.
Figure 23:
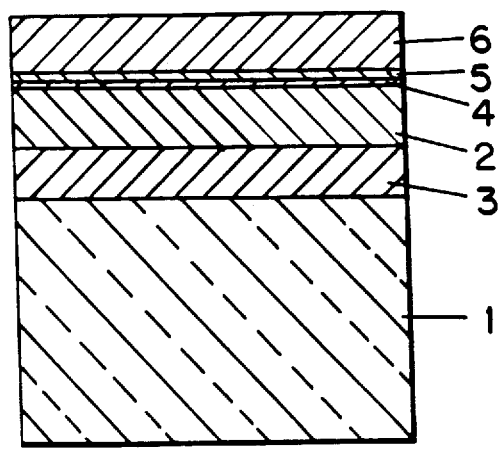
FIG. 23 shows the cross section of a substrate of conventional technology showing the step of fabricating a first $SiO_2$ layer, an SiN layer, and a second $SiO_2$ layer.
Figure 24:
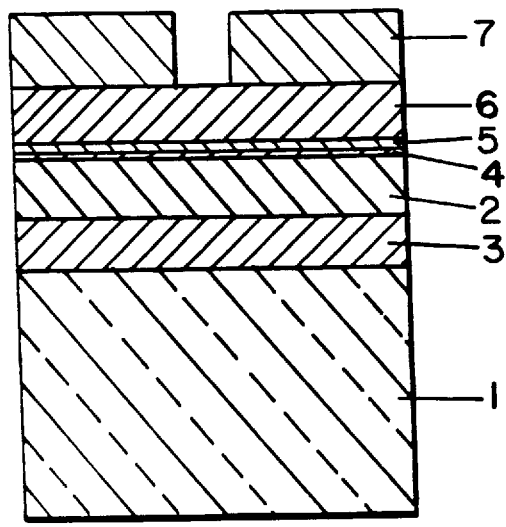
FIG. 24 shows the cross section of a substrate of conventional technology showing the step of fabricating a resist pattern having a groove with an opening on the second $SiO_2$ layer.
Figure 25:
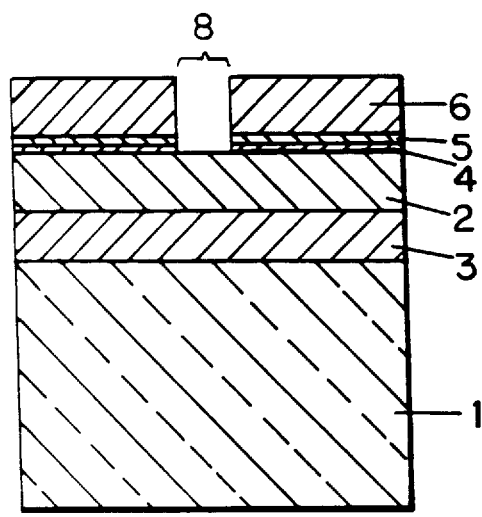
FIG. 25 shows the cross section of a substrate of conventional technology showing the step of forming an opening reaching an n-type epitaxial layer.
Figure 26:
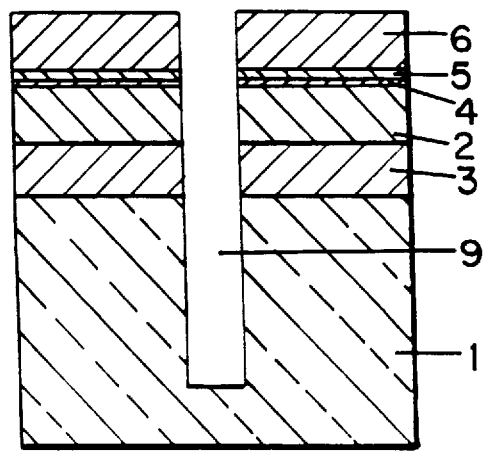
FIG. 26 shows the cross section of a substrate of conventional technology showing the step of forming a trench.
Figure 27:
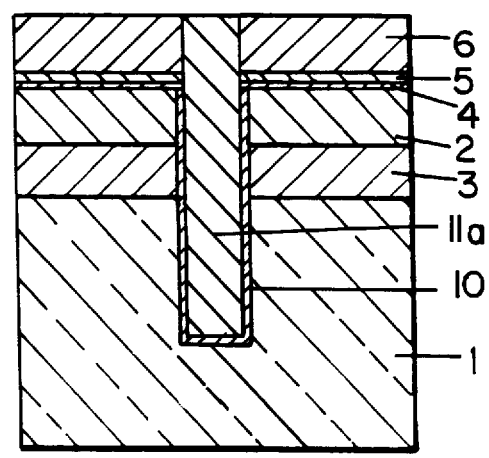
FIG. 27 shows the cross section of a substrate of conventional technology showing the step of fabricating a third SiO2 layer and filling the first polysilicon layer in the trench.
Figure 28:
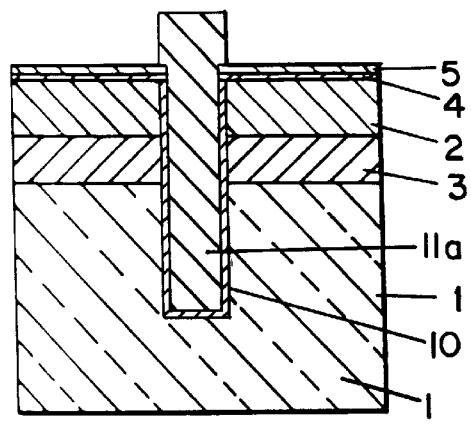
FIG. 28 shows the cross section of a substrate of conventional technology showing the step of removing the second $SiO_2$ layer.
Figure 29:
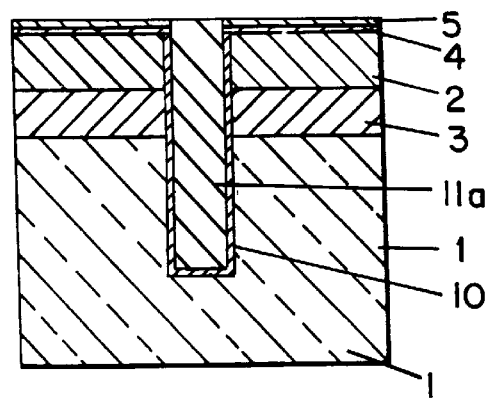
FIG. 29 shows the cross section of a substrate of conventional technology showing the step of etching back the first polysilicon layer.
Figure 30:
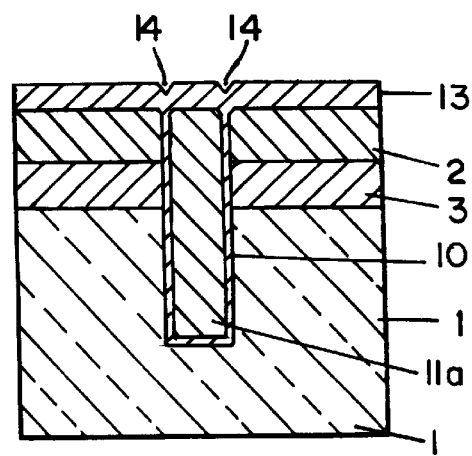
FIG. 30 shows the cross section of a substrate of conventional technology showing the step of fabricating a field oxide layer after the removal of the SiN layer and the first $SiO_2$ layer.

After that, pattern the SiN layer 5 in a desired pattern; and fabricate a field oxide layer 13, 500 nm thick, by an oxidation method (FIG. 22). At this time, once the SiN layer 5 is patterned, the first SiO$_2$ layer 4 may be removed before forming the field oxide layer 13.

After forming the field oxide layer 13, deposit a conductive layer for patterning.

A distinctive feature of the second embodiment of the invention is the etch step of the third SiO$_2$ layer 10. As illustrated in FIGS. 16 through 20, the second embodiment uses the trench-filled first polysilicon layer 11a formed such that it fills the trench as a mask during etching of the third SiO$_2$ layer 10 in the region 16 on top of the trench 9. It has been described already that the first embodiment also uses the polysilicon layer 12 as a mask, however, the embodiment assumes that the third SiO$_2$ layer 10 on top of the trench 9 is exposed as illustrated in FIG. 6. On the other hand, the second embodiment deposits the first polysilicon layer 11a such that it refills the trench 9 completely as illustrated in FIG. 16. The polysilicon layer 11a in the region 16 on top of the trench 9 is finally removed in the step illustrated in FIG. 19 to expose the third SiO$_2$ layer 10. Then, the second polysilicon layer 11b is formed such that it covers the third SiO$_2$ layer 10; nevertheless, in the second embodiment, the first polysilicon layer 11a filled into the trench 9 remains as it is except that the top of the trench 9 is removed; it is further deposited with a second polysilicon layer 11b over the first polysilicon layer 11a to complete refilling of the trench 9. Therefore, the second embodiment does not include the step of etching the third SiO$_2$ layer 10 at the bottom of the trench 9, thus perfectly isolating the semiconductor 1 and the first polysilicon layer 11a. This method is effective when there is a limitation in the depth of the trench 9 or the thickness of the third SiO$_2$ layer 10, thus electrically isolating the semiconductor substrate 1 and the first polysilicon layer 11a perfectly.

The first embodiment prevents the third SiO$_2$ layer from oxidation during formation of the field oxide layer 13 by coating the third SiO$_2$ layer 10 with the first polysilicon layer 11a.

In addition, the second embodiment prevents oxidation progression during formation of the field oxide layer 13 by coating the third SiO$_2$ layer 10 with the second polysilicon layer 11b. In other words, removing the portion of the third SiO$_2$ layer 10 in the region 16 on top of the trench 9 prevents the third SiO$_2$ layer 10 from being exposed during deposition of the first polysilicon layer 11a or the second polysilicon layer 11b; under these conditions, the third SiO$_2$ layer 10 will not be oxidized even during the fabrication of the field oxide layer 13.

Note that an aggressive oxidation, if performed before fabricating the field oxide layer 13, may promote indirect oxidation through the first polysilicon layer 11a, the second polysilicon layer 11b, and the semiconductor substrate 1, etc. Therefore, when fabricating the field oxide layer 13, it is important that the oxidation is terminated as soon as the first polysilicon layer 11a or the second polysilicon layer 11b reaches the edge of the third SiO$_2$ layer 10. Among methods of controlling oxidation of the first polysilicon layer 11a or the second polysilicon layer 11b, the thermal oxidation method with variable parameters of temperatures or time is effective; control of oxidation will be much more effective if the levels of the vertical progression of oxidation for the first polysilicon layer 11a or the second polysilicon layer 11b over these variables are known in advance.

Also the embodiments of the present invention encompass the step of planarizing the surfaces of the first polysilicon layer 11a or the second polysilicon layer 11b which simplifies manufacturing control. This trench isolation method does not expand the third SiO$_2$ layer during fabrication of a field oxide layer. Therefore, it initially reduces the possibility of generating vertical bird's beaks.

Moreover, without vertical bird's beaks, there will be no concavity on the field oxide layer 13. The fact that there are no vertical bird's beaks provides for efficient patterning of a conductive layer. In other words, the concavity generally generates etch residues on a conductive layer, requiring etching of the residues for planarizing the field oxide layer 13; the present invention does not require this step. Moreover, due to the vertical bird's beak being controlled, there is no expansion of the third SiO$_2$ layer during oxidation in the trench 9, eliminating physical stress within the semiconductor substrate 1; this prevents the generation of crystalline defects in the semiconductor substrate.

As described, the present invention provides a manufacturing method for a semiconductor device which controls the generation of vertical bird's beaks in IC trenches; this prevents ICs from shorting between interconnects due to etch residues on the semiconductor device and also prevents the generation of crystalline defects in semiconductor substrates, etc.

What is claimed is:

1. A method of manufacturing a semiconductor device comprising:
    a) forming an epitaxial layer over a semiconductor substrate;
    b) depositing a first SiO$_2$ layer, an SiN layer and a second SiO$_2$ layer in that order upon said epitaxial layer;
    c) forming a trench from said second SiO$_2$ layer extending into said semiconductor substrate with said trench having sidewalls in cross section;
    d) forming a third SiO$_2$ layer coating in said trench over said sidewalls;
    e) removing a region of said third SiO$_2$ layer adjacent to said first SiO$_2$ layer to expose a portion of said epitaxial layer within said trench;
    f) filling said trench with a first polysilicon layer;
    g) removing said second SiO$_2$ layer and said SiN layer; and
    h) oxidizing said first SiO$_2$ layer to a depth extending into said epitaxial layer so as to form a field oxide layer.

2. The method of claim 1, wherein said trench has a bottom end, further comprising the step I) removing said third SiO$_2$ layer from the bottom end of said trench to expose said semiconductor substrate.

3. The method of claim 2, wherein said semiconductor substrate is also oxidized at the bottom end of the trench.

4. The method of claim 1, wherein in step h), the surface of said first polysilicon layer is planed by etching off said first polysilicon layer using said SiN layer or said first SiO$_2$ layer layer as an etch-barrier layer.

5. The method of claim 4, wherein when planing the surface of said first polysilicon layer, said SiN layer or said first SiO$_2$ layer and said first polysilicon layer are to be on the same plane.

6. The method of claim 4, wherein said first polysilicon layer is etched by means of chemical-mechanical polishing.

7. A method of manufacturing a semiconductor device comprising:

a) forming an epitaxial layer over a semiconductor substrate;

b) depositing a first SiO$_2$ layer, an SiN layer, and a second SiO$_2$ layer in that order upon said epitaxial layer;

c) forming a trench from said second SiO$_2$ layer extending into said semiconductor substrate with said trench having sidewalls in cross section;

d) forming a third SiO$_2$ layer coating in said trench over said sidewalls;

e) filling said trench with a first polysilicon layer;

f) removing said second SiO$_2$ layer to expose said SiN layer after the formation of said first polysilicon layer;

g) removing a region of said third SiO$_2$ layer adjacent to said first SiO$_2$ layer to expose a portion of said epitaxial layer within said trench;

h) depositing a second polysilicon layer on said third SiO$_2$ layer that is remains within said trench following step g and on said first polysilicon layer in said trench;

i) removing said SiN layer after the formation of said second polysilicon layer; and j) oxidizing said second polysilicon layer to form a field oxide layer to a depth extending within said trench inclusive of said exposed portion of said epitaxial layer.

8. The method of claim 7, wherein the step of oxidizing said second polysilicon layer to form a field oxide layer also oxidizes said semiconductor substrate.

9. The method of claim 7, wherein the step of oxidizing said second polysilicon layer to form a field oxide layer the surface of said polysilicon layer is planed by etching said second polysilicon layer using said SiN layer or said first SiO$_2$ layer as an etch-barrier layer.

10. The method of claim 9, wherein when planing the surface of said polysilicon layer, said SiN layer or said first SiO$_2$ layer and the surface of said second polysilicon layer are to the same plane.

11. The method of claim 9, wherein etching of said second polysilicon layer is performed by means of chemical-mechanical polishing.

* * * * *